US 6,624,079 B2

(12) United States Patent
Tsai et al.

(10) Patent No.: US 6,624,079 B2
(45) Date of Patent: Sep. 23, 2003

(54) METHOD FOR FORMING HIGH RESISTANCE RESISTOR WITH INTEGRATED HIGH VOLTAGE DEVICE PROCESS

(75) Inventors: Yuan-Li Tsai, Taipei (TW); Marcus Yang, Chang-Hua (TW); Ralph Chen, Taichung (TW); Heng-Chun Kao, Taipei (TW); Ching-Chun Hwang, Taichung (TW)

(73) Assignee: United Microelectronics Corp. (TW)

( * ) Notice: Subject to any disclaimer, the term of this patent is extended or adjusted under 35 U.S.C. 154(b) by 32 days.

(21) Appl. No.: 09/931,953

(22) Filed: Aug. 20, 2001

(65) Prior Publication Data
US 2003/0036276 A1 Feb. 20, 2003

(51) Int. Cl.$^7$ ............................................. H01L 21/311
(52) U.S. Cl. ........................ 438/694; 438/702; 438/719
(58) Field of Search ................................. 438/381–385, 438/694, 702, 719, 723

(56) References Cited

U.S. PATENT DOCUMENTS

| | | | |
|---|---|---|---|
| 4,291,328 A | * 9/1981 | Lien et al. | 257/379 |
| 5,352,923 A | * 10/1994 | Boyd et al. | 257/536 |
| 5,677,228 A | * 10/1997 | Tseng | 438/238 |
| 5,705,418 A | * 1/1998 | Liu | 438/238 |
| 6,054,359 A | * 4/2000 | Tsui et al. | 438/385 |
| 6,211,031 B1 | * 4/2001 | Lin et al. | 438/384 |

* cited by examiner

Primary Examiner—Kin-Chan Chen (57) ABSTRACT

The method for forming high voltage device combined with a mixed mode process use an un-doped polysilicon layer instead of the conventional polysilicon layer. In the high resistance area, the ion implant is not used until the source region and the drain region are formed. A resistor is formed by etching oxide-nitride-oxide layer and performing ion implant process by using $BF_2$ radical to the un-doped polysilicon layer to control the resistance. Then multitudes of contact are formed, wherein the high dosage of $BF_2$ implant would reduce resistance between contacts and resistor.

27 Claims, 9 Drawing Sheets

FIG.3

METHOD FOR FORMING HIGH RESISTANCE RESISTOR WITH INTEGRATED HIGH VOLTAGE DEVICE PROCESS

BACKGROUND OF THE INVENTION

1. Field of the Invention

The present invention relates to a method for forming high resistance resistor. More particularly, the present invention relates to a method for forming a high resistance resistor with integrated high voltage device process.

2. Description of the Prior Art

Isolation is provided in a semiconductor between transistors on a semiconductor chip to prevent unwanted electrical connections there between. On the development of ultra-large-scale-integrated (ULSI), layout rule will shrink and the application of product is going to invent on multi-chip of integrated function.

Figure 1:
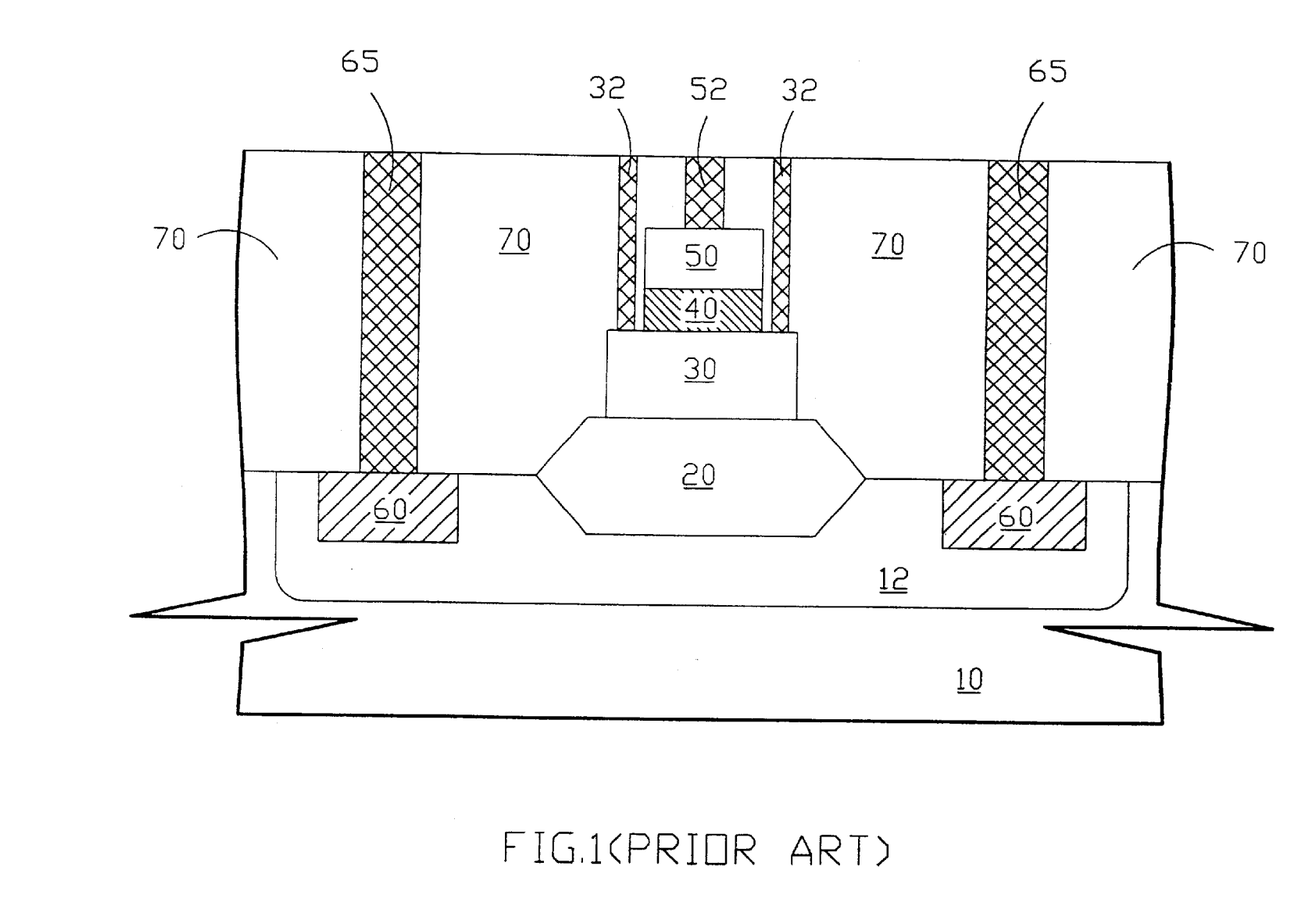
FIG. 1 is a cross sectional view of convention method illustrating for forming high resistance resistor with integrated high voltage process, wherein the N-well as resistor is formed in the substrate.

In conventional methods, a substrate 10 comprise a implemented N-well 12, and a field oxide area 20 is formed on the substrate 10, wherein the N-well is a high resistance area of high voltage device such as shown in FIG. 1. A mixed-mode process can provide a process flow with embedded capacitor in logic circuit. The additional capacitor can be used for RC analog circuit or other special applications. A first electrode 30 of capacitor is formed on the field oxide area 20. An interpoly dielectric layer 40 such as oxide-nitride-oxide (ONO) layer is formed on the first electrode 30. A second electrode 50 of capacitor is formed on the oxide-nitride-oxide layer 40. The first electrode 30 and second electrode 50 are comprised polysilicon layer. An interlevel dielectric layer 70 is formed over the substrate 10 and capacitor. Then etch interlevel dielectric layer 70 to form a plurality contact hole. A conductive material is deposited to form contacts. Such as a contact 65 connect to high concentration area of N-well 60, a contact 32 connect to first electrode 30 and contact 52 connect to second electrode 50 of capacitor.

However, in the conventional process to form a high resistance resistor with an integrated high voltage device process, the high resistance area of N-well is pre-formed in the substrate. Then to be continued process to a formed capacitor has several thermal treatments then will induce a variation of devices. They will cause different bias voltage.

SUMMARY OF THE INVENTION

It is therefore an objective of the invention to provide a method of manufacturing a high voltage device. The capacitor and high resistance resistor are formed by the same fabricating step.

To achieve these and other advantages and in accordance with the purpose of the invention, as embodied and broadly described herein, the invention provides a method for forming a high resistance resistor with an integrated high voltage device process.

In this invention, a process in the formation of a high resistance resistor with an integrated high voltage device process is desired. A substrate comprised explanation a field oxide area. An un-doped polysilicon layer is deposited on the field oxide area. An interpoly dielectric layer such as oxide-nitride-oxide (ONO) layer is formed on the un-doped polysilicon layer. Then etch oxide-nitride-oxide layer and processing ion implant process by $BF_2$ implant to the un-doped polysilicon layer. Adjusting dosage of BF2 controls the resistance of resistor. An interlevel dielectric layer such as silicon oxide is formed on the substrate and the resistor. The silicon oxide layer is etched to form contact holes. An ion implant process is performed to reduce resistance between contact and resistor by $BF_2$ radical. The thermal rapid processing (RTP) increased ion diffusion of ion implant and a metal is deposited to formed contact.

In this invention, the high voltage device combined with mixed mode processes by using un-doped polysilicon layer instead of the conventional polysilicon layer. First the source region and drain region is formed, then the high resistance area with ion implant. In this high resistance area: first, etch oxide-nitride-oxide layer, second, ion implant process by using $BF_2$ radical to the un-doped polysilicon layer to form resistor. Adjusting dosage of $BF_2$ controls the resistance. Next performing contact etched, the high dosage of $BF_2$ implant to high resistance area to reduce resistance between contact and resistor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention will now be described with reference to the drawings, wherein like reference numerals are used to refer to like elements throughout.

Figure 2A:
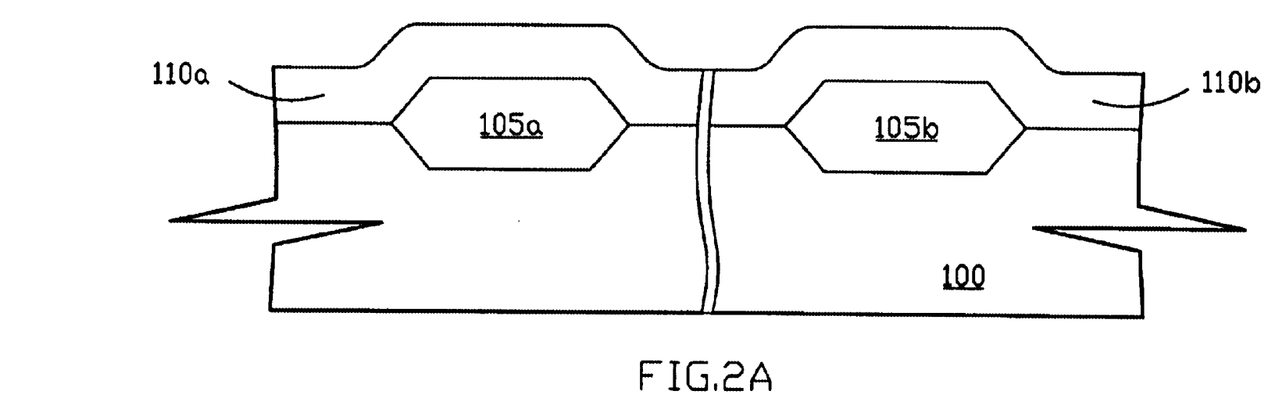
FIGS. 2A through FIG. 2H are cross sectional view of this invention illustrating for forming high resistance resistor with integrated high voltage process.

First, as shown in FIG. 2A, a substrate 100 is provided. A first field oxide area 105a and second field oxide area 105b are formed on the substrate 100 by using a conventional method such as a thermal oxidation method. Between the first field oxide area 105a and second field oxide area 105b comprises a transistor structure (not shown in the figure). Polysilicon layers 110a and 110b are deposited over the substrate 100 and field oxide area 105a, 105b, wherein the polysilicon layer 110a, 110b are un-doped polysilicon layer with a thickness about 1500 angstroms.

Figure 2B:
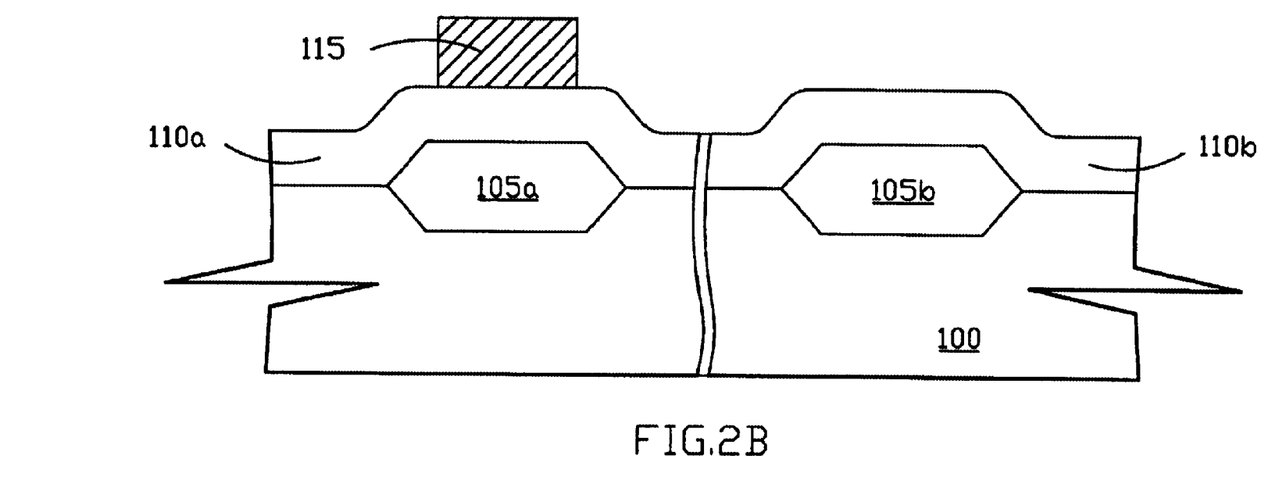

Next, as shown in FIG. 2B, a photoresist layer 115 is formed on the polysilicon layer 110a, wherein the photoresist layer 115 has a resistance pattern. Utilizing the photoresist layer 115 as a mask, a procedure using first, an ion implant process on the polysilicon layer 110b is performed. Then, the polysilicon layer 110b becomes a doped polysilicon layer. The first ion implant process is performed by using a phosphorous implant and improved ion diffusion with an annealing temperature of about 1000° C.–1100° C.

Figure 2C:
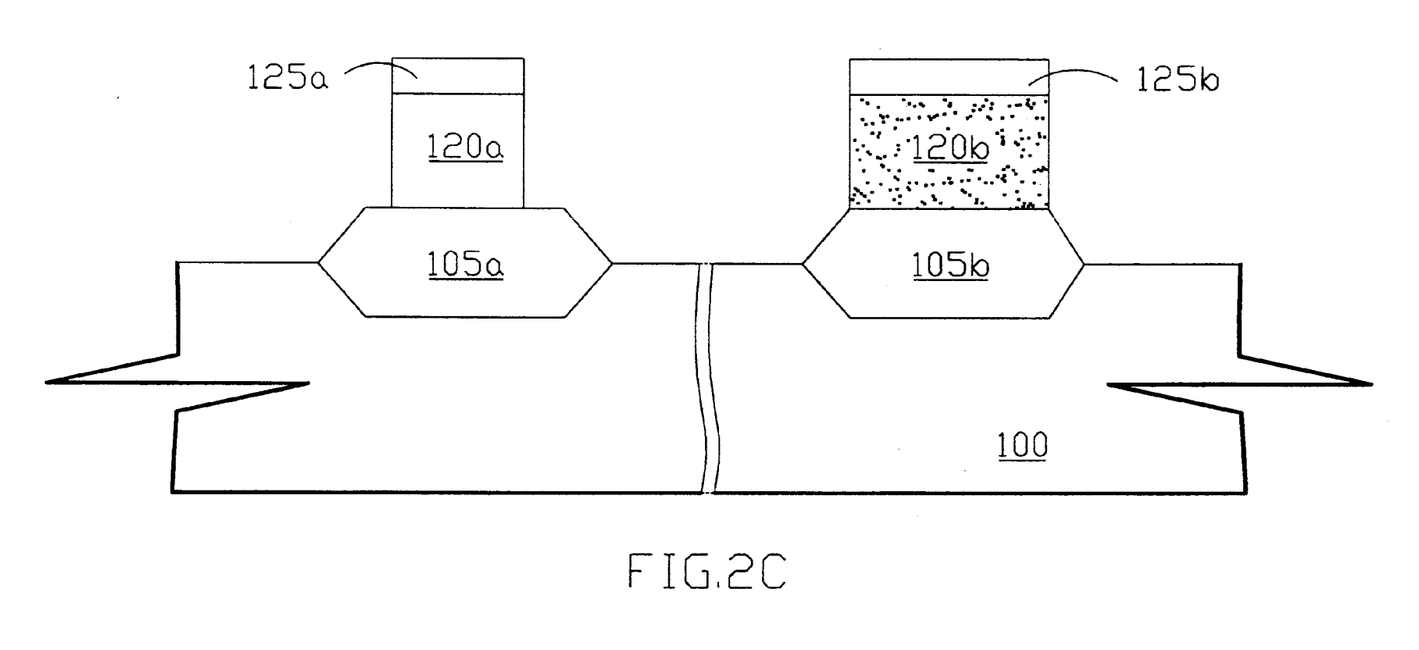

Next step as shown in FIG. 2C, the photoresist layer 115 is removed. An interpoly dielectric layer such as oxide-nitride-oxide (ONO) layer is formed on the polysilicon layer by a conventional method. Then, the oxide-nitride-oxide layer and the polysilicon layer are etched with a conventional etching method. The un-doped polysilicon layer resistor 120a on the first field oxide area 105a. The interpoly dielectric layer 125a on the resistor 120a. The resistor 120a on the first field oxide area 105a serve as high resistance area. The doped polysilicon layer 120b after first ion implant process on the second field oxide area 105b. The doped polysilicon layer 120b serves as first electrode of capacitor. The interpoly dielectric layer 125b on the first electrode 120b. In the same step, gate structure is formed any area except the field oxide area 105a, 105b. The source region and drain region are formed by standard process after this step (not shown in figure).

Figure 2D:
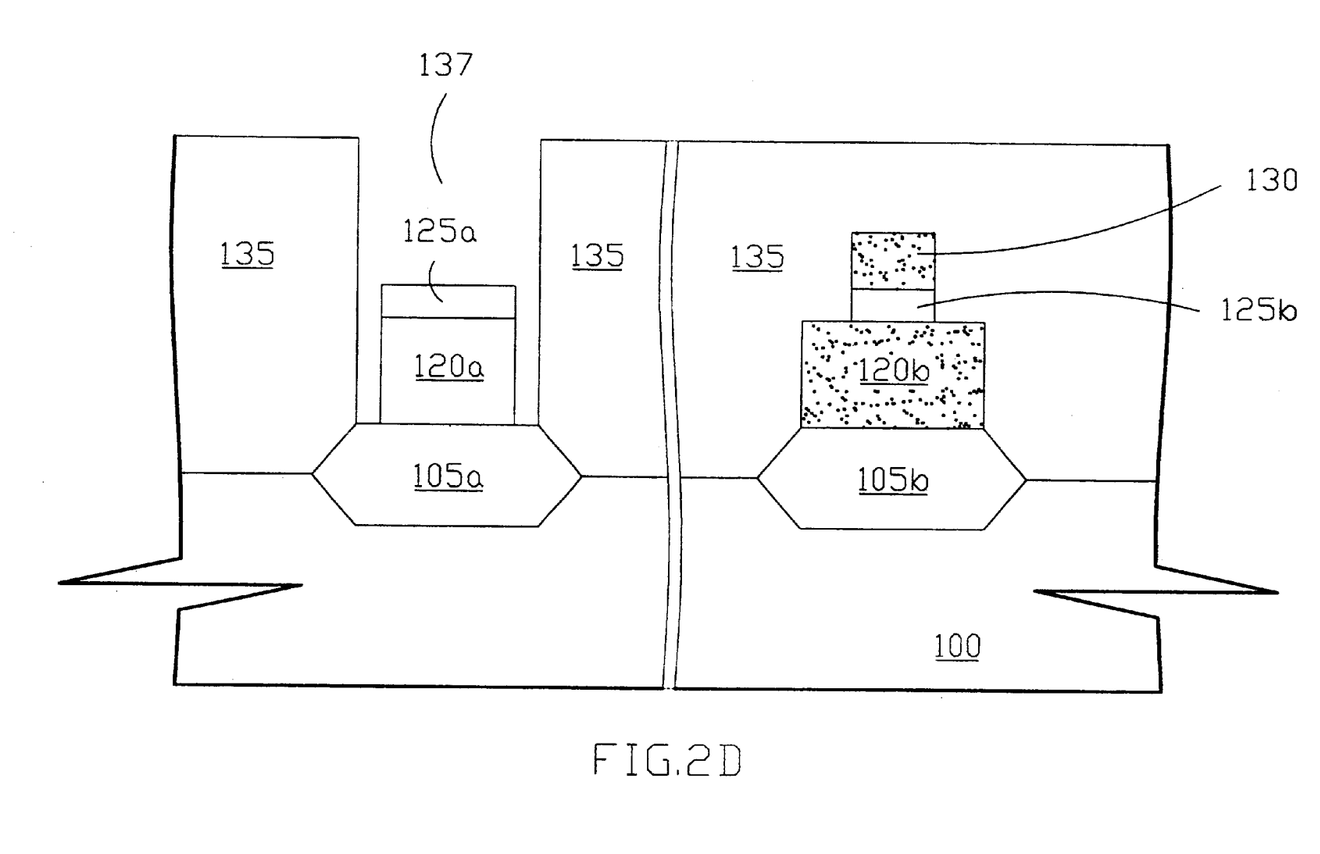

Next step as shown in FIG. 2D, a second polysilicon layer 130 is formed on the oxide-nitride-oxide layer 125b, wherein the second polysilicon layer is doped. The second polysilicon layer 130 serve as second electrode of capacitor. A second photoresist layer 135 is formed on the substrate 100, capacitor and high resistance area 120a wherein the photoresist layer 135 has an opening pattern 137 to expose the high resistance area 120a.

Figure 2E:
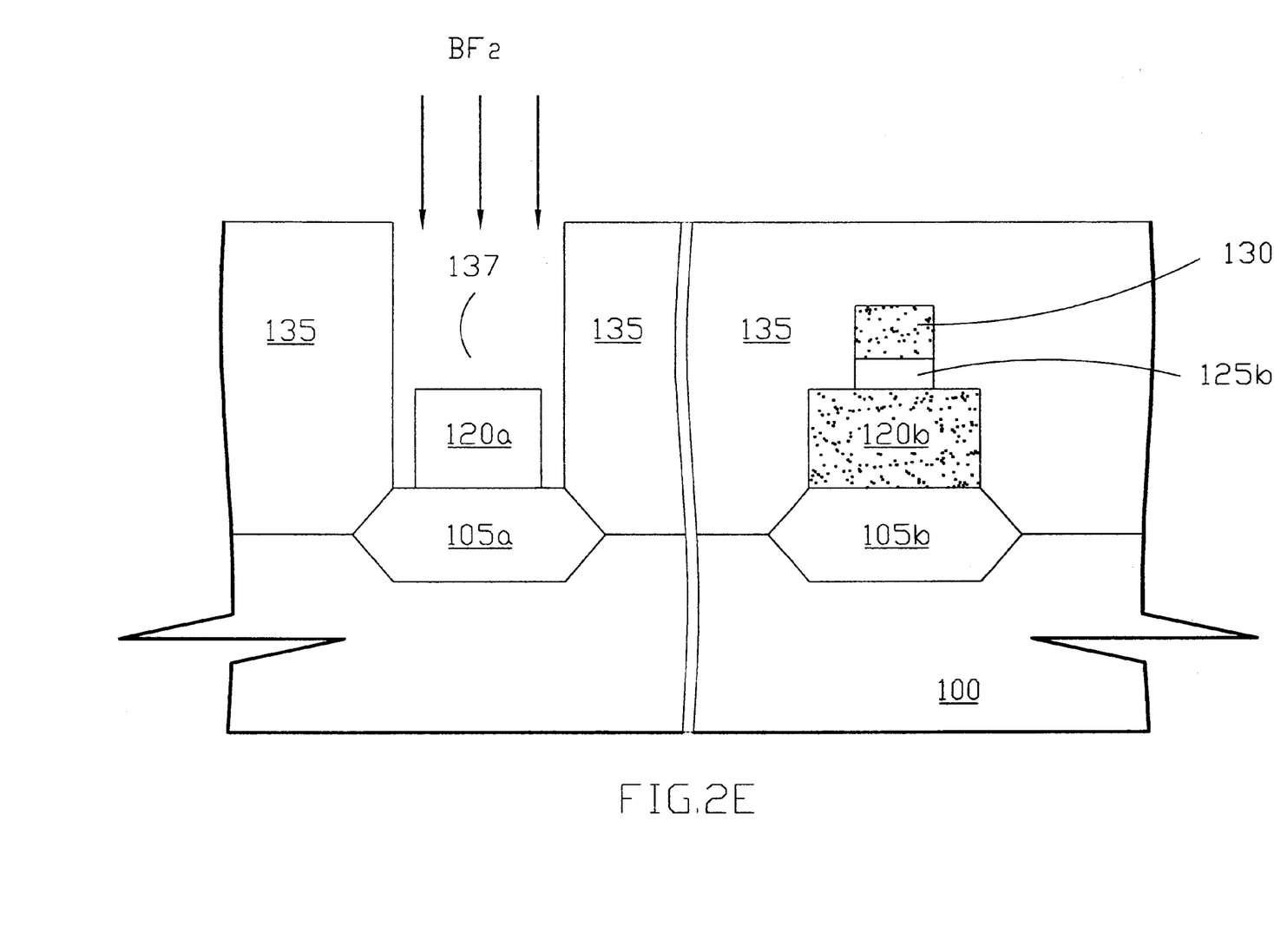
Figure 3:
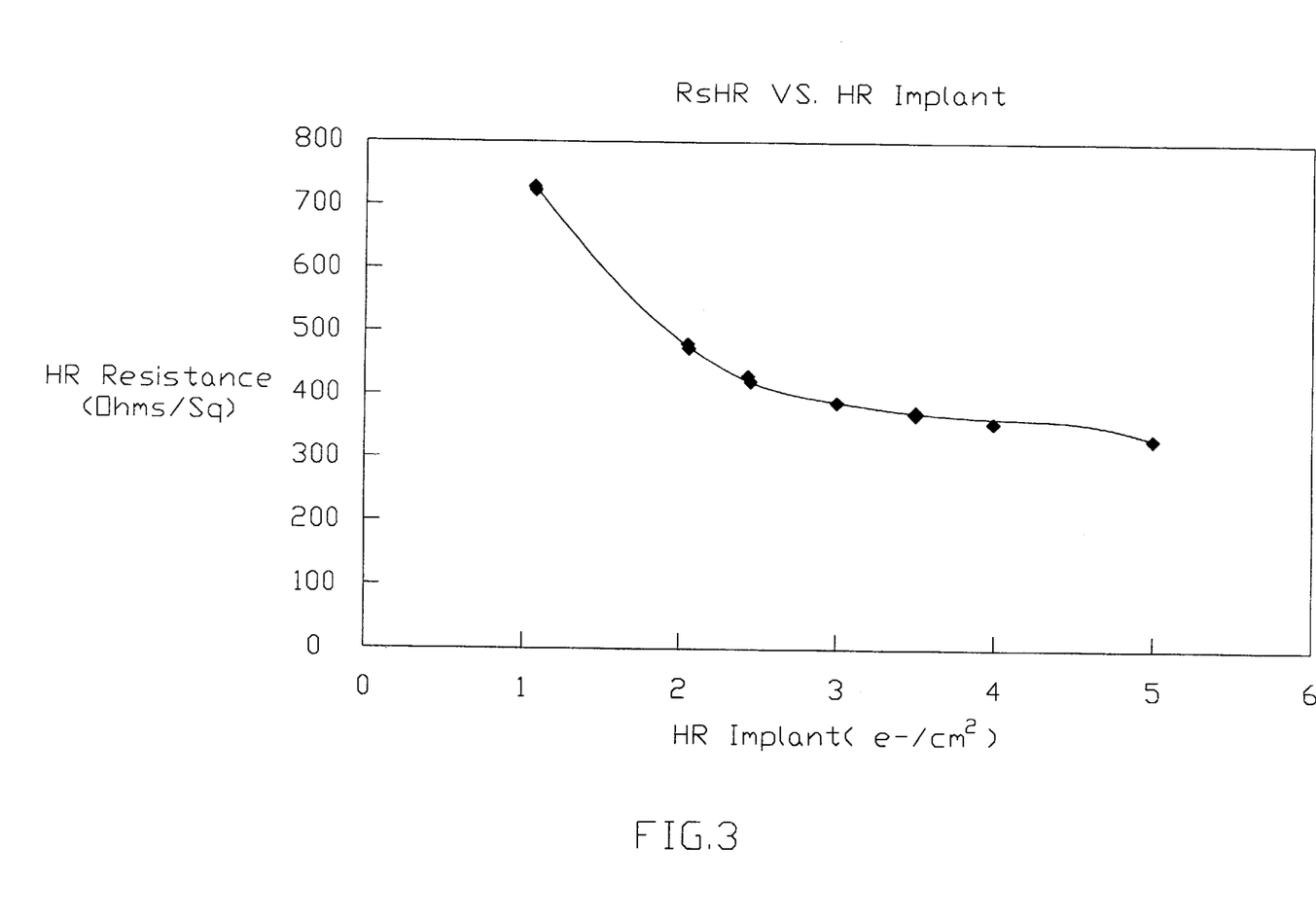
FIG. 3 is correlation curve of ion implant dosage with resistance.

Dry etching or wet etching method removes the oxide-nitride-oxide layer 125; this is an important step of this invention. In this embodiment, dry etching is the preferred method. The resistance of the un-doped polysilicon layer 120a is very high after the removal of the oxide-nitride-oxide layer 125a. Then, utilizing the second ion implant process the resistance is therefore controlled. In this invention the second ion implant process to the un-doped polysilicon layer 120a is achieved by using $BF_2$ radical. The correlation curve of resistance and ion implant dosage is shown in FIG. 3. Adjusting the dosage of BF2 controls the resistance. The function is:

$$Y=-12.317x^3+146.12x^2-590.48x+1177.6$$

Y: resistance (Ohms/Sq)
X: implant dosage (e-/cm2)
$r^2=0.9985$

Figure 2F:
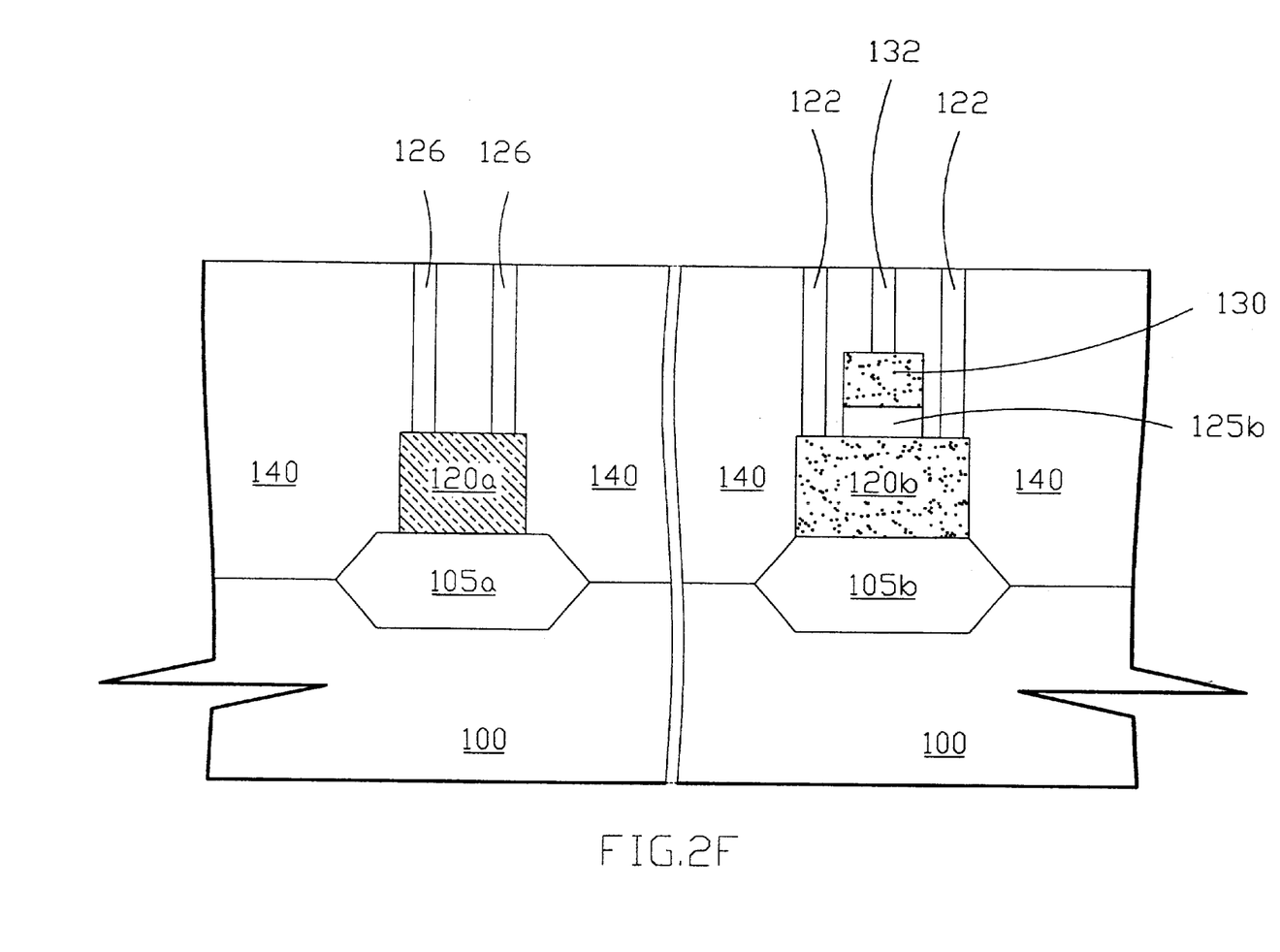

Next, as shown in FIG. 2F, the second photoresist layer 135 is removed. An interlevel dielectric layer 140 such as silicon oxide is formed on the substrate 100, the high resistance area 120a and the capacitor. Silicon oxide 140 is achieved by using the spin-on-glass (SOG) method or another suitable method. The interlevel dielectric layer 140 processing re-flow step temperature is controlled to about 850° C. At the same time the re-flow step can improve the second ion implant process diffusion to resistor 120a. Next, using a standard process in the interlevel dielectric layer 140 forms a plurality of contact hole 122, 132, and 126. The contact hole 126 connects to resistor 120a. The contact hole 122 connects to the first electrode and the contact hole 132 connects to the second electrode of the capacitor.

Figure 2G:
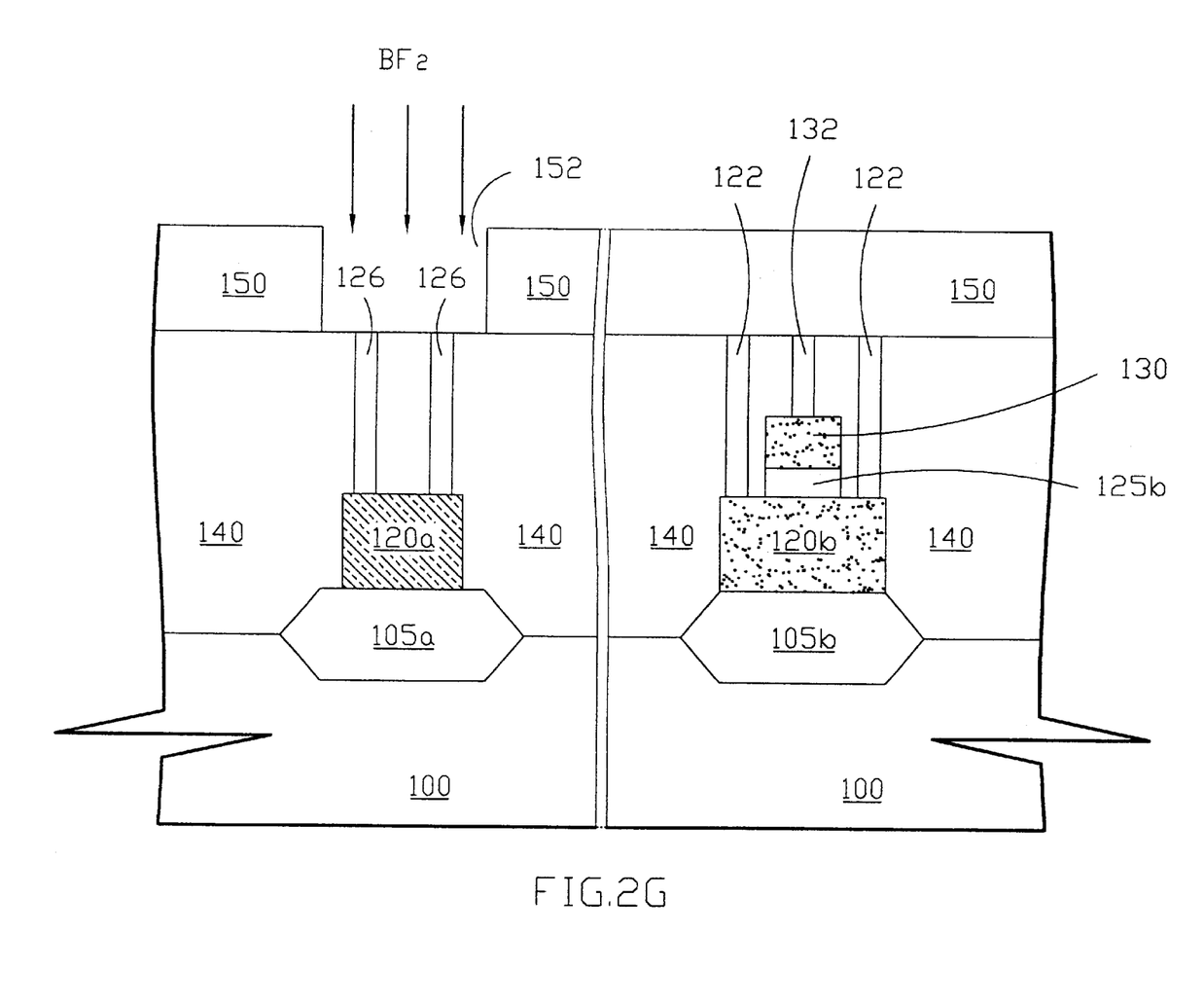

Next, as shown in FIG. 2G, a third photoresist layer 150 is formed on the interlevel dielectric layer 140, wherein the third photoresist layer 140 has an opening pattern 152 to expose the contact hole 126. To reduce the resistance of interface between the contact hole 126 and resistor 120a there must be a third ion implant process by using $BF_2$ radical. The dosage of the third ion implant process is more than second ion implant process by over 2 times. The third photoresist layer 150 is removed. After the third ion implant process, performing rapid thermal processing (RTP) to improved ion diffuse. The rapid thermal process temperature is about 900° C.

Figure 2H:
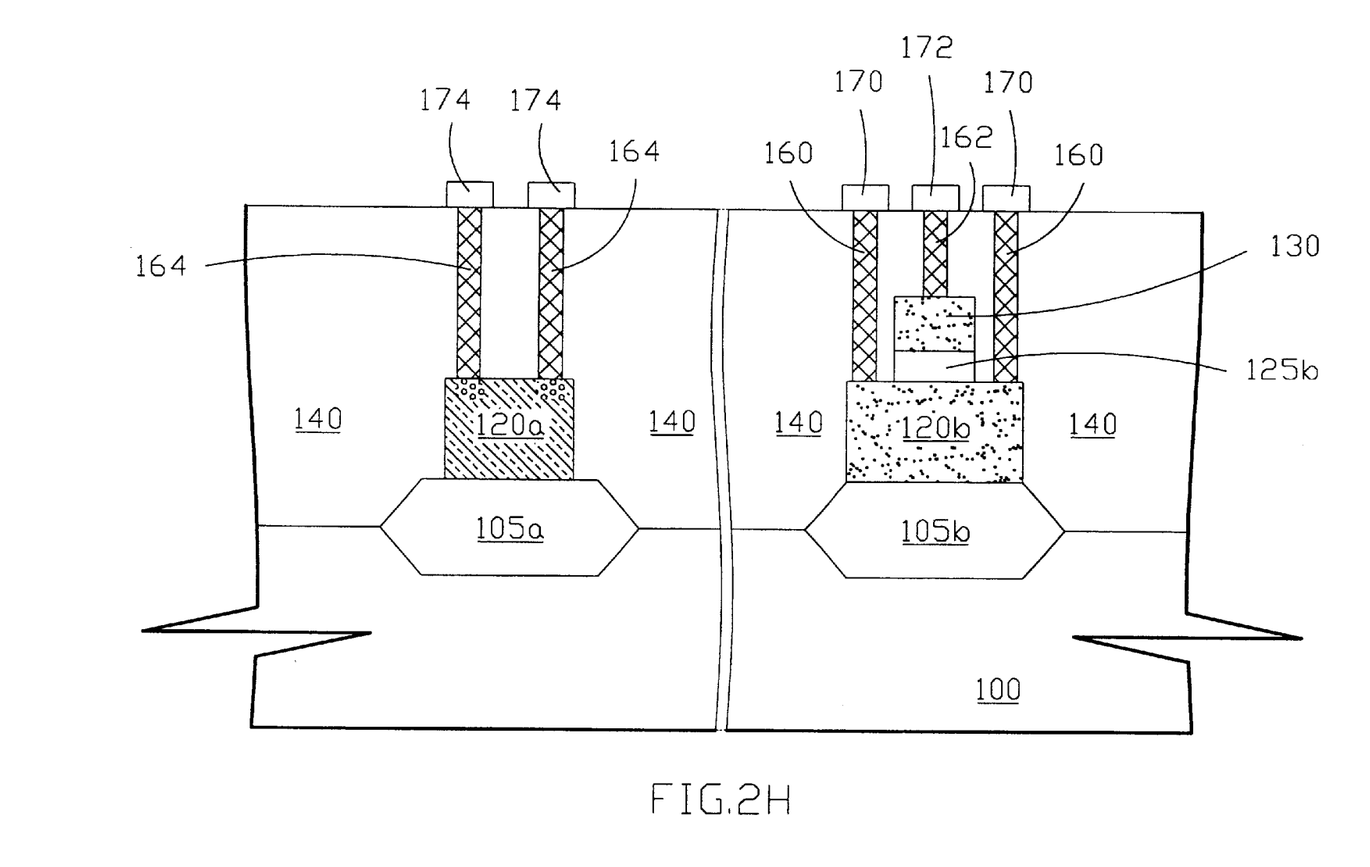

Next, as shown in FIG. 2H, a conductive material is deposited to fill contact holes 122, 132, 126 in order to form contacts 160, 162, and 164. The contact 164 connect to resistor 120a. The contact 160 connect to first electrode 120b and contact 162 connect to second electrode 130 of capacitor. Next, an interconnect layer such as 170, 172, and 174 is formed on the interlevel dielectric layer 140.

While the invention has been particularly shown and described with reference to the preferred embodiments thereof, it will be understood by those skilled in the art that various changes in form and details may be made without departing from the spirit and scope of the invention.

What is claimed is:

1. A method for forming high resistance resistor with integrated high voltage device process, said method comprising:

providing a substrate;

forming a first field oxide area and a second field oxide area on said substrate;

depositing a first polysilicon layer over said substrate, said first field oxide area and said second field oxide area, wherein said first polysilicon layer is un-doped;

forming a first photoresist layer on said first field oxide area, wherein said first photoresist layer has a resistor pattern;

performing a first ion implant process by using said first photoresist layer as a mask to said first polysilicon layer;

removing said first photoresist layer;

forming an oxide-nitride-oxide layer on said first polysilicon layer;

etching said oxide-nitride-oxide layer and said first polysilicon layer to form a resistor on said first field oxide area and a first electrode of a capacitor on said second field oxide area;

forming a second polysilicon layer on said oxide-nitride-oxide layer of said capacitor as a second electrode of said capacitor;

forming a second photoresist layer on said substrate, said resistor and said capacitor, wherein said second photoresist layer has an opening pattern to expose said resistor;

removing said oxide-nitride-oxide layer on said resistor;

performing a second ion implant process to said resistor;

removing said second photoresist layer;

depositing an interlevel dielectric layer over said substrate, said capacitor and said resistor;

etching said interlevel dielectric layer to form a plurality of contact holes on said capacitor and said resistor;

forming a third photoresist layer on said interlevel dielectric layer, wherein said third photoresist layer has an opening pattern to expose said contact holes on said resistor;

performing a third ion implant process to said resistor by using said third photoresist layer as a mask;

performing a rapid thermal process; and depositing a conductive material layer fill into said plurality of contact holes.

2. The method of claim 1, wherein forming said first field oxide area and second field oxide area are comprised thermal oxidation method.

3. The method of claim 1, wherein the thick of said first polysilicon layer is about 1500 angstroms.

4. The method of claim 1, wherein performing said first ion implant process is by using phosphorous implant.

5. The method of claim 1, further comprising an anneal process wherein the temperature of said anneal process is about 1000° C.–1100° C.

6. The method of claim 1, wherein removing said oxide-nitride-oxide layer on said resistor is dry etch method.

7. The method of claim 1, wherein the resistance of said resistor is controlled by adjusting dosage of $BF_2$ of second ion implant process.

8. The method of claim 7, wherein performing said third ion implant process is by using $BF_2$ radical.

9. The method of claim 8, wherein a dosage of said third ion implant process is over 2 times more than a dosage of said second ion implant process.

10. The method of claim 1, wherein said interlevel dielectric layer is silicon oxide.

11. The method of claim 1, further comprising a re-flow process after deposited an interlevel dielectric layer wherein the temperature is about 850° C. to improve ion diffusion of said second ion implant process.

12. The method of claim 1, wherein the temperature of said rapid thermal process is about 900° C.

13. A method for forming high resistance resistor with integrated high voltage device process, said method comprising:

forming a first field oxide area and a second field oxide area on a substrate;

depositing a first polysilicon layer over said substrate, said first field oxide area and said second field oxide area;

forming a first photoresist layer on said first polysilicon layer of said first field oxide area, wherein said first photoresist layer has a resistor pattern;

performing a first ion implant process to said first polysilicon layer by using said first photoresist layer as a mask;

removing said first photoresist layer;

forming a first dielectric layer on said first polysilicon layer;

etching said first dielectric layer and said first polysilicon layer to form a resistor on said first field oxide area and a first electrode of a capacitor on said second field oxide area;

forming a second polysilicon layer serve as a second electrode of said capacitor;

forming a second photoresist layer on said substrate, said resistor and said capacitor, wherein said second photoresist layer has an opening pattern to expose said resistor;

removing said first dielectric layer on said resistor by using said second photoresist layer as a mask;

performing a second ion implant process to said resistor;

depositing a second dielectric layer on said substrate, said resistor and said capacitor;

performing a re-flow process; and performing a contact etch process.

14. The method of claim 13, wherein forming said first field oxide area and second field oxide area are comprised thermal oxidation method.

15. The method of claim 13, wherein the thick of said first polysilicon layer is about 1500 angstroms.

16. The method of claim 13, wherein said first polysilicon layer is un-doped.

17. The method of claim 13, wherein performing said first ion implant process is by using phosphorous implant.

18. The method of claim 17, wherein after said first ion implant process comprise anneal process and the temperature about 1000° C.–1100° C.

19. The method of claim 13, wherein said first dielectric layer is oxide-nitride-oxide layer.

20. The method of claim 13, wherein removing said first dielectric layer on said resistor is dry etch method.

21. The method of claim 13, wherein performing said second ion implant process is by using $BF_2$ radical and the resistance of said resistor is controlled by adjusting dosage of $BF_2$.

22. The method of claim 13, wherein said second dielectric layer is silicon oxide.

23. The method of claim 13, wherein the temperature of said re-flow process is about 850° C.

24. The method of claim 13, wherein performing said contact etch process comprises:

etching said second dielectric layer to form a plurality of contact holes on said capacitor and said resistor;

forming a third photoresist layer on said second dielectric layer, wherein said third photoresist layer has an opening pattern to expose said contact holes on said resistor;

performing a third ion implant process to said resistor;

performing a rapid thermal process; and forming an interconnect layer on said second dielectric layer.

25. The method of claim 24, wherein performing said third ion implant process is by using $BF_2$ radical.

26. The method of claim 25, wherein a dosage of said third ion implant process is over 2 times more than a dosage of said second ion implant process.

27. The method of claim 24, wherein the temperature of said rapid thermal process is about 900° C.

* * * * *